United States Patent [19]

Hayashi

[11] Patent Number: 5,202,307
[45] Date of Patent: Apr. 13, 1993

[54] METHOD OF MANUFACTURING SUPERCONDUCTING WIRE

[75] Inventor: Kazuhiko Hayashi, Osaka, Japan

[73] Assignee: Sumitomo Electric Industries, Ltd., Osaka, Japan

[21] Appl. No.: 885,065

[22] Filed: May 15, 1992

Related U.S. Application Data

[63] Continuation of Ser. No. 648,321, Jan. 29, 1991, abandoned, which is a continuation of Ser. No. 178,405, Mar. 24, 1988, abandoned.

[30] Foreign Application Priority Data

Mar. 30, 1987 [JP] Japan .................................. 62-77238

[51] Int. Cl.$^5$ ............................................. H01L 39/12
[52] U.S. Cl. ......................................... 505/1; 505/704; 505/740; 505/778; 505/780; 505/785; 419/67; 419/68; 419/69; 29/599
[58] Field of Search ................... 29/599; 505/1, 740, 505/778, 780, 704, 785; 428/558; 419/67, 68, 69; 75/235, 234

[56] References Cited

U.S. PATENT DOCUMENTS

| | | |
|---|---|---|
| 3,796,553 | 3/1974 | Daunt. |
| 4,050,147 | 9/1977 | Winter et al. ................ 29/599 |
| 4,108,737 | 8/1978 | Ehrhardt et al. ................ 204/13 |
| 4,411,959 | 10/1983 | Braginski et al. ................ 428/558 |
| 4,642,218 | 2/1987 | Rice ................................ 419/11 |
| 4,762,754 | 8/1988 | Nellis et al. ........................ 418/552 |
| 4,770,701 | 9/1988 | Henderson et al. ................ 75/232 |
| 4,826,808 | 5/1989 | Yurek et al. ........................ 505/1 |
| 4,962,084 | 10/1990 | deBarbadillo, II et al. .......... 419/19 |
| 4,981,840 | 1/1991 | Brown et al. ........................ 505/1 |
| 4,999,338 | 3/1991 | Wijeyesekera et al. ............... 505/1 |

FOREIGN PATENT DOCUMENTS

2613285 2/1978 Fed. Rep. of Germany.

OTHER PUBLICATIONS

Mar. 1987 Physical Review Letters, vol. 58, No. 9, pp. 908-910.

*Primary Examiner*—Donald P. Walsh
*Assistant Examiner*—Ngoclan T. Mai
*Attorney, Agent, or Firm*—Pennie & Edmonds

[57] ABSTRACT

A method of manufacturing a superconducting wire consisting essentially of mixing superconducting ceramic powders selected from a group selected from a group consisting of Y-Sr-Cu-O, Y-Ba-Cu-O, La-Sr-Cu-O, La-Ba-Cu-O and Bi-Sr-Ca-Cu-O with metal powder, filling the mixture in a metal pipe and forming the mixture into wire by at least one of extrusion, drawing and swaging. The resulting wire would have superconductivity which is not reduced upon distortion by external stress.

3 Claims, 1 Drawing Sheet

METHOD OF MANUFACTURING SUPERCONDUCTING WIRE

This is a continuation of application Ser. No. 07/648,321, filed Jan. 29, 1991, now abandoned, which is a continuation of application Ser. No. 07/178,405, filed Mar. 24, 1988, now abandoned.

BACKGROUND OF THE INVENTION

1. Field of the Invention

The present invention relates to a superconducting wire employing ceramics powder showing superconductivity and a method of manufacturing the same.

2. Description of the Prior Art

It has recently been recognized with great interest that a superconductive material of ceramics shows a high critical temperature of superconductivity. However, such a ceramics superconductive material is generally inferior in workability, and it has been difficult to linearly work the same into a wire rod. Even if such a ceramics superconductive material can be worked into a wire rod, continuity thereof is spoiled by cracking etc. or its superconductivity is reduced by distortion etc. when bending stress or the like is applied in order to shape the wire rod into a coil, since the same has no flexibility.

SUMMARY OF THE INVENTION

An object of the present invention is to provide a superconducting wire which can prevent reduction in superconductivity even if distortion is caused by external stress, and a method of manufacturing the same which can easily manufacture such a superconducting wire by plastic working.

The superconducting wire according to the present invention is characterized in that particles, being in proximity to each other, of ceramics powder showing superconductivity are dispersed in a metal matrix.

The material for the ceramics powder employed in the present invention is not particularly restricted, so far as the same is superconductive. For example, such ceramics powder can be prepared by a superconductive material which is generally expressed in a formula $A_aB_bC_c$, where A represents at least a sort of element selected from a group of those belonging to the groups Ia, IIa and IIIa of the periodic table, B represents at least a single sort of element selected from a group of those belonging to the groups Ib, IIb and IIIb of the periodic table and C represents at least a single sort of element selected from a group of oxygen, carbon, nitrogen, fluorine and sulfur, and the usual a, b and c represent numbers showing composition ratios of A, B and C respectively. The elements belonging to the group Ia of the periodic table are H, Li, Na, K, Rb, Cs and Fr. The elements belonging to the group IIa of the periodic table are Be, Mg, Ca, Sr, Ba and Ra. The elements belonging to the group IIIa of the periodic table are Sc, Y, La, Ce, Pr, Nd, Pm, Sm, Eu, Gd, Tb, Dy, Ho, Er, Tm, Yb, Lu, Ac, Th, Pa, U, Np, Pu, Am, Cm, Bk, Cf, Es, Fm, Md, No and Lr. The elements belonging to the group Ib of the periodic table are Cu, Ag and Au. The elements belonging to the group IIb of the periodic table are Zn, Cd and Hg. The elements belonging to the group IIIb of the periodic table are B, Al, Ga, In and Tl.

In particular, A preferably contains at least two sorts of elements selected from the group of those belonging to the groups Ia, IIa and IIIa of the periodic table. Further, at least copper is preferably contained as B and at least oxygen is preferably contained as C.

The usual a, b and c preferably satisfy ax (average valence of A)+bx (average valence of B)=cx (average valence of C).

The ceramics powder employed in the present invention may be prepared by a layer structure compound comprising oxygen and at least two sorts of metal elements.

In the superconducting wire according to the present invention, it is necessary to set the volume ratio and grain spacing of the ceramics powder to effectuate superconductivity as a whole, depending on the composition ratio etc. of the ceramics powder as employed. Such volume ratio and grain spacing also depend on particle size of the ceramics powder as employed. Superconductivity of the inventive superconducting wire is explained through a proximity effect and percolation theory, and hence the volume ratio, grain spacing and particle size of the ceramics powder are set in consideration of such effect and theory.

Well-known superconductive ceramics powder is prepared by Y-Sr-Cu-O ceramics, Y-Ba-Cu-O ceramics, La-Sr-Cu-O ceramics or La-Ba-Cu-O ceramics, for example, and it has been confirmed that an excellent effect can be obtained with such ceramics powder of not more than 10 μm in particle size and at least 15% in volume ratio.

Preferably the metal matrix is prepared by copper or aluminum, for example. A normal conduction metal such as copper of aluminum can be employed as a stabilizing material in a superconductive state.

A manufacturing method according to the present invention is characterized in that superconductive ceramics powder is mixed with metal powder and filled in a metal pipe, to be linearized by plastic working.

In the present invention, the plastic working is preferably performed by extrusion, rolling, swaging or wire drawing, or through combination of two or more such methods.

The metal powder is not particularly restricted so far as the same is superior in plastic workability to the ceramics powder. For example, the metal powder can be prepared by silver, copper or aluminum powder, to form a metal matrix which can also serve as a stabilizing material.

The metal pipe can be formed by a pipe of silver, copper, aluminum, niobium, vanadium, molybdenum or tantalum.

In the superconducting wire according to the present invention, the particles of the ceramics powder showing superconductivity are merely in proximity to each other, but not in contact with each other. However, superconductive current flows through the metal forming the matrix by a proximity effect of superconductivity and the like, to effectuate superconductivity as a whole.

The metal matrix is adapted to absorb mechanical distortion, and hence superconductivity is not reduced eve if distortion is caused in the superconducting wire by external stress.

When the metal matrix is prepared by silver, copper or aluminum of small electric resistance and large thermal conductivity, the same serves as a stabilizing material for superconduction so that no other means is required to combine a stabilizing material.

In the manufacturing method according to the present invention, ceramics powder is mixed with the metal powder, so that plastic working is enabled in the mixed state through ductility etc. of the metal powder.

Further, the amount of the metal powder, i.e., the ratio of the metal matrix can be controlled by changing the mixing ratio of the metal powder to the ceramics powder. Thus, the ratio of the metal matrix, which is prepared by metal powder of copper for serving as a stabilizing material, can be controlled.

These and other objects, features, aspects and advantages of the present invention will become more apparent from the following detailed description of the present invention when taken in conjunction with the accompanying drawings.

DESCRIPTION OF THE PREFERRED EMBODIMENTS

Example 1

Figure 1:
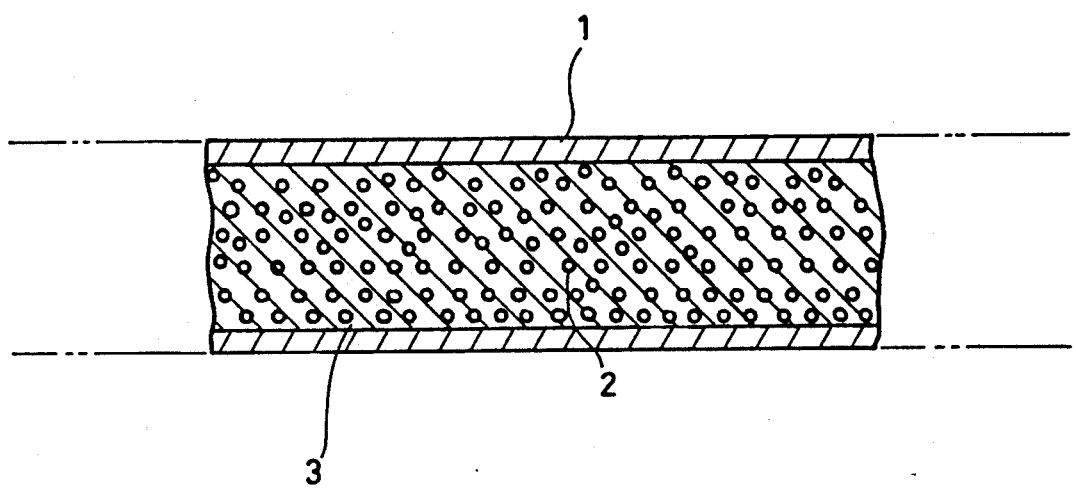
FIG. 1 is a sectional view showing an embodiment of the superconducting wire according to the present invention.

Superconductive ceramics powder of 10 μm in particle size, being in composition of $Y_{0.8}Sr_{0.2}CuO_3$ was mixed with Cu powder to be 30% in volume ratio, and this mixture was filled in a copper pipe of 20 mm in outer diameter and 14 mm in inner diameter. This substance was worked by extrusion to be 6 mm in diameter at 900° C., subjected to cold swaging to be 3 mm in diameter, and then subjected to wire drawing to be 1 mm in diameter.

It has been confirmed that a wire thus obtained entered a superconductive state at 40 K, to serve as a superconducting wire. Its superconductivity was not reduced even if tensile strain of 1% was applied. This wire was not burned out in transition into normal conduction during energization, and it has been confirmed that the copper matrix around the ceramics powder served as a stabilizing material.

Reference example was prepared by filling only ceramics powder in a copper pipe with no mixing of Cu powder, to perform wire drawing similarly to Example 1. However, it was impossible to perform wire drawing of the reference example. This reference example was subjected to swaging in place of wire drawing followed by application of tensile strain, whereby its critical temperature (Tc) of superconduction was reduced to 10 K with strain of 0.3%.

Example 2

Superconductive ceramics powder of 5 μm in particle size, being in composition of $Y_{0.8}Ba_{0.2}CuO_3$, was mixed with Al powder to be 50% in volume ratio. This mixture was filled in an Al pipe of 10 mm in outer diameter and 6 mm in inner diameter, and worked to be 1 mm in diameter through swaging and wire drawing.

FIG. 1 is a sectional view typically showing a wire thus obtained. Referring to FIG. 1, numeral 1 indicates a metal pipe prepared by Al, numeral 2 indicates particles of the ceramics powder and numeral 3 indicates a metal matrix. The wire thus obtained entered a superconductive state at 80 K. Such superconductivity was not reduced even if tensile strain of 1% was applied.

Example 3

Superconductive ceramics powder of 1 μm in particle size, being in composition of $Bi_1Sr_1Ca_1Cu_2O_x$, was mixed with Ag powder to be 70% in volume ratio. This mixture was filled in an Ag pipe of 15 mm in outer diameter and 12 mm in inner diameter, and worked to be 1.5 mm in diameter through swaging.

The wire thus obtained entered a superconductive state at 100 K. Such superconductivity was not reduced even if bending strain of 1.5% was applied.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a high temperature superconductive superconducting wire, comprising the steps of:
   (a) mixing ceramic powder selected from a group consisting of Y-Sr-Cu-O, Y-Ba-Cu-O, La-Sr-Cu-O, La-Ba-Cu-O and Bi-Sr-Ca-Cu-O ceramic with a particle size of 10 μm or less showing high temperature superconductivity with metal powder wherein the volume ratio of the ceramic powder to the metal powder is in the range of about 15:85 to 70:30;
   (b) filling the mixture in a metal pipe; and
   (c) elongating the same by extrusion, drawing or swaging so as to form a high temperature superconductive superconducting wire without heating said wire after said step (c), the wire having superconductivity which is not reduced upon distortion of the wire by external stress.

2. A method of manufacturing a superconducting wire in accordance with claim 1, wherein
   powder of silver, copper or aluminum is employed as said metal powder.

3. A method of manufacturing a superconducting wire in accordance with claim 1, wherein
   a pipe of silver, copper, aluminum, niobium, vanadium, molybdenum or tantalum is employed as said metal pipe.

* * * * *